US006236060B1

(12) United States Patent
Chan et al.

(10) Patent No.: US 6,236,060 B1
(45) Date of Patent: *May 22, 2001

(54) LIGHT EMITTING STRUCTURES IN BACK-END OF LINE SILICON TECHNOLOGY

(75) Inventors: Kevin Kok Chan, Staten Island; Sandip Tiwari, Ossining, both of NY (US)

(73) Assignee: International Business Machines Corporation, Armonk, NY (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/974,215

(22) Filed: Nov. 19, 1997

(51) Int. Cl.[7] .................. H01L 29/06; H01L 31/072; H01L 31/109; H01L 27/15; H01L 33/00
(52) U.S. Cl. .................. 257/13; 257/11; 257/17; 257/79; 257/103
(58) Field of Search .................. 257/17, 11, 79, 257/103, 189, 13

(56) References Cited

U.S. PATENT DOCUMENTS

| 4,802,181 | * | 1/1989 | Iwata .................. 372/45 |
| 5,059,001 | * | 10/1991 | Shimizu .................. 359/24 |
| 5,075,742 | * | 12/1991 | Gerard et al. .................. 357/17 |
| 5,262,357 | | 11/1993 | Alivisatos et al. .................. 438/488 |
| 5,293,050 | * | 3/1994 | Chapple-Sokol et al. .................. 257/17 |
| 5,670,790 | * | 9/1997 | Katoh et al. .................. 257/14 |
| 5,714,766 | * | 2/1998 | Chen et al. .................. 257/17 |
| 5,780,867 | * | 7/1998 | Fritz et al. .................. 257/13 |
| 5,852,346 | * | 12/1998 | Komoda et al. .................. 315/169.3 |
| 5,936,258 | * | 8/1999 | Imamura et al. .................. 257/21 |

FOREIGN PATENT DOCUMENTS

| 410209572 | * | 8/1998 | (JP) . |
| 410294523 | * | 11/1998 | (JP) . |

OTHER PUBLICATIONS

Nakamura et al. ("Bright electroluminescence from CdS quantum dot LED structures", Electronics Letters, vol. 34, Issue 25, Dec. 10, 1998, pp. 2435–2436).*

Sugiyama et al. ("Observation of spectral hole burning in photocurrent spectrum of InAs seft–assembled quantum dots embedded in PIN diode", Electronics Letters, vol. 33, Issue 19, Sep. 11, 1997, pp. 1655–1657).*

Yoshida et al. ("A Novel Electroluminescent Diode with Nanocrystalline Silicon Quantum Dots", Electron Devices Meeting, 1996., International, 1996, pp. 417–420), No month given.*

B. Johnstone (1995) "Japan Heads for Quantum" *New Scientist 1967*: 32–37, Mar. 1995.

S. Tiwari et al. (1995) "Volatile and Non–volatile Memories in Silicon With Nano–crystal Storage" *IEDM*: 521–522, 524. 1995 (No month given).

* cited by examiner

Primary Examiner—Jerome Jackson, Jr.
Assistant Examiner—Allan R. Wilson
(74) Attorney, Agent, or Firm—Scully, Scott, Murphy & Presser; Marian Underweiser, Esq.

(57) ABSTRACT

A light emitting device is disclosed comprising a bottom layer of electrically conductive material. A block of electrically insulating material is disposed on the bottom layer. At least a portion of the block is optically transparent. A top layer of electrically conductive material is disposed on the block. A plurality of discrete nano-crystals of a material selected from the group consisting of Group IV, Group III-V, and Group II-VI is disposed within the block, and are thereby electrically insulated from the top and bottom layers. Also provided are bottom and top electrodes connected to the bottom and top layers, respectively, for applying a voltage therebetween.

24 Claims, 4 Drawing Sheets

LIGHT EMITTING STRUCTURES IN BACK-END OF LINE SILICON TECHNOLOGY

BACKGROUND OF THE INVENTION

1. Field of the Invention

The field of art to which this invention relates is light emitting structures. Specifically, the present invention relates to light emitting structures in back-end of line silicon technology.

2. Description of the Related Art

Most group IV elements and their compounds are poor optical emitters. Optically pumped efficient emission has been shown in porous-silicon (a matrix of quantum-wires formed through electro-oxidation in Hydrofluoric acid) over a considerable period of time although it has suffered from rapid degradation. To date, unstable optically-pumped emission has been achieved in porous silicon and this emission is believed to be caused by multidimensional confinement in nano-structures as well as by defects at surfaces. Photoluminescence has also been observed in silicon nano-particles and silicon implanted in silicon dioxide. Both a certain nano-particle size and a surface termination are needed simultaneously to achieve luminescence at a reasonable efficiency. Harnessing these properties to achieve stable electro-luminescence is of considerable interest as a means of achieving opto-electronic integration in silicon.

For the above reasons, there is a need in the art for a light emitting structure which is stable over a period of time and which can be practiced in back-end of line silicon technology.

SUMMARY OF THE INVENTION

Therefore, it is an object of the present invention to provide a group IV element light emitting structure which is stable over a period of time.

Another object of the present invention is to improve optical emission properties of group IV elements.

Another object of the present invention is to provide a light emitting structure which can be practiced in back-end of line silicon technology.

Yet still another object of the present invention is to provide a group IV element light emitting structure which is easily fabricated.

The present invention provides light emitting structures using group IV elements such as silicon, germanium, and GaAs using nano-crystals that are capable of acceptable optical emission properties due to efficient injection of electrons and holes, modification of band structure, and modification of surface properties.

Accordingly, a first embodiment of a light emitting device is disclosed comprising a bottom layer of electrically conductive material. A block of electrically insulating material is disposed on the bottom layer. At least a portion of the block is optically transparent. A top layer of electrically conductive material is disposed on the block. A plurality of discrete nano-crystals of a material selected from the group consisting of Group IV, Group III-V, and Group II-VI is disposed within the block, and are thereby electrically insulated from the top and bottom layers. Also provided are bottom and top electrodes connected to the bottom and top layers, respectively, for applying a voltage therebetween.

A variation of the first embodiment of the light emitting device is also disclosed wherein the block comprises a bottom layer of said electrically insulating material having the nano-crystals disposed thereon and a top layer of the electrically insulating material formed over the nano-crystals.

A second embodiment of the light emitting structure of the present invention is also disclosed wherein a plurality of said blocks are stacked upon one another. The plurality of blocks being disposed between the bottom layer and the top layer.

A variation of the second embodiment of the light emitting device is also disclosed wherein each block comprises a bottom layer of said electrically insulating material having a bottom plurality of discrete nano-crystals disposed thereon, at least one middle layer of electrically insulating material formed over the bottom nano-crystals and having a middle plurality of nano-crystals disposed thereon, and a top layer of electrically insulating material formed over the last middle plurality of nano-crystals.

BRIEF DESCRIPTION OF THE DRAWINGS

These and other features, aspects, and advantages of the apparatus of the present invention will become better understood with regard to the following description, appended claims, and accompanying drawings where:

DETAILED DESCRIPTION OF THE PREFERRED EMBODIMENTS OF THE INVENTION

Electro-luminescence requires efficient light-emitting recombination of electron-hole pairs. This can occur within a semiconductor material where carriers exist for direct recombination. It can also occur at surfaces through defects that mediate electron-hole recombination. Research has shown, for silicon, that Hydrogen, Fluorine, Erbium, and possibly other acceptor-like impurities make efficient surface-based luminescence possible. Nano-crystals have also shown evidence of luminescence. Thus, formation of nano-crystals, appropriate surface termination of the nano-crystals, and efficient injection of electrons and holes, are necessary ingredients of a high efficiency electro-luminescent structure.

A nano-crystal is defined to be a crystallite having dimensions in the nanometer range, that is, of approximately 1–50 nm. Materials in their nano-crystalline form can be formed by various precipitation techniques known in the art which are designed to prevent macro-crystal formation.

This invention describes the use of nano-crystals of silicon and germanium, formed on thin oxides, with possible use of stress and appropriate termination of the nano-particle surface, enclosed within a thin oxide for obtaining a range of light emission wavelengths. The thin oxides are used to separate electrodes from the nano-crystals but allow efficient high current density, low power tunneling injection of both electrons and holes into the nano-crystal. The electrodes are therefore composed of materials such as silicon or poly-silicon doped to either type. The structure will allow efficient light emission into free space as well as into integrated waveguides. Furthermore, the light emitting structures of the present invention can be integrated into the back-end of silicon processing.

The following are possible nano-crystal materials for use in the present invention, however, they are given by way of example and not to limit the scope of the invention:
Group IV—Si, SiGe, SiC.
Group III-V—GaAs, GaInAs, InAs, InP, GaInAsP, InSb, GaAlAs, GaSb, GaInSb, GaN, GaInN.
Group II-VI—ZnSe, ZnTe, ZnSeTe, CdSe, CDS, ZnCdS, ZnCdSe, ZnCdSeTe, ZnCdSTe.

Figure 1:
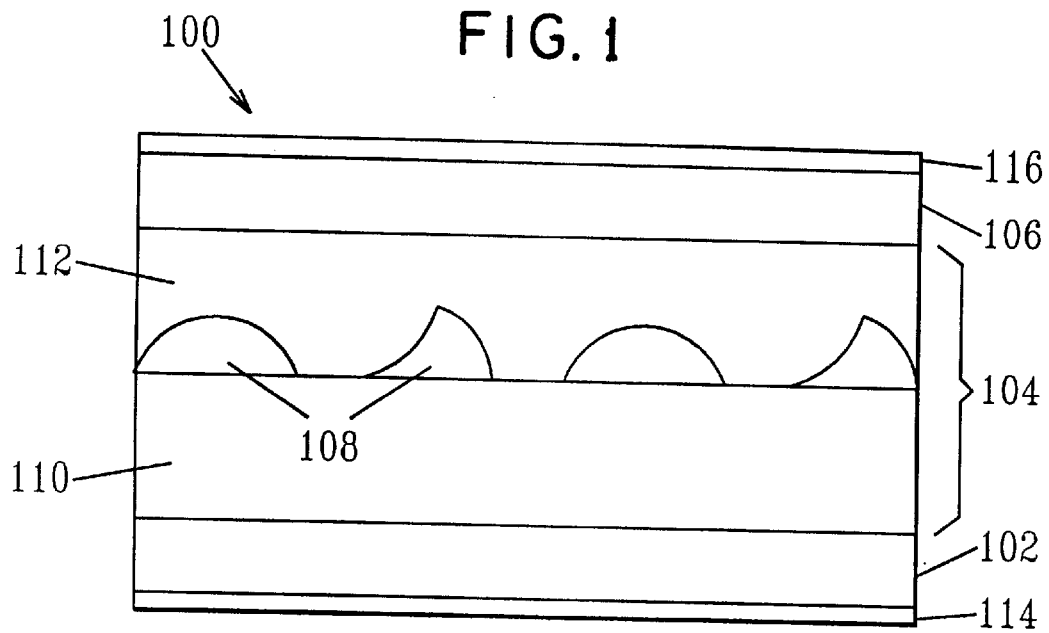
FIG. 1 illustrates a first embodiment of a light emitting structure of the present invention.

Referring now to FIG. 1, there is illustrated a first embodiment of a light emitting structure of the present invention, generally referred to by reference numeral 100. A bottom layer of electrically conductive material 102 is provided upon which a block 104 is disposed. The block 104 is an electrically insulating material in which at least a portion of it is optically transparent. A top layer of electrically conductive material 106 is disposed on the block.

The bottom and top layers of electrically conductive materials 102, 106 can be doped poly-silicon, tin oxide, indium oxide, indium tin oxides, other conducting oxides, or thin metals, but are preferably polysilicon doped to either n or p types. Preferably, the bottom layer of electrically conductive material 102 is p-doped polysilicon, and the top layer of electrically conductive material 106 is n-doped polysilicon. The block 104 of electrically insulating material is preferably a thin oxide with a thickness in the 1–50 nm range.

A plurality of discrete nano-crystals 108 of a material selected from Group IV, Group III-V, and Group II-VI are disposed within the block 104 and are therefore electrically insulated from the bottom and top layers of electrically conductive materials 102, 106. At least the portion of the block 104 between the nano-crystals 108 and the top layer of the electrically conductive material 106 is optically transparent. The nano-crystals 108 can be grown by any method known in the art and are preferably grown by chemical vapor deposition at sub-atmospheric pressures from gases such as SiH4, GeH4, Trimethyl Gallium, Gallium Chloride, Arsine, Arsenic Trichloride, Phoshine, Trimethyl Indium, Indium Chloride, Nitrogen, or Ammonia. The nano-crystal size is preferably in the range of 15 to 170 Angstroms and the nano-crystals 108 are substantially spaced apart so as not to form a continuous film, preferably the spacing is greater than 1 nm.

Alternatively, the block 104 comprises a bottom layer of electrically insulating material 110 on which the plurality of discrete nano-crystals 108 are disposed or formed and a top layer of electrically insulating material 112 disposed or formed over the nano-crystals 108. Preferably, only the top layer of electrically insulating material 112 is optically transparent. As discussed previously, the electrically insulating materials are preferably thin oxides.

Figure 3:
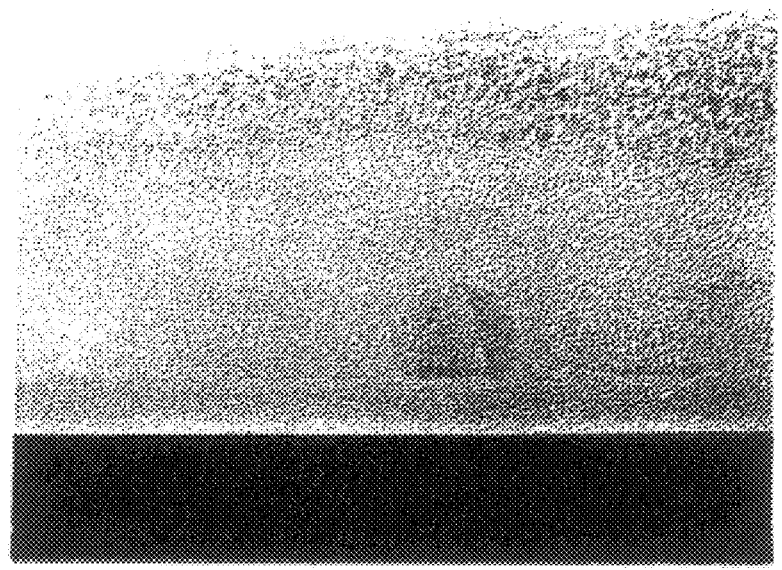
FIG. 3 is a photograph showing silicon nano-crystals deposited on an oxide surface.

The thin oxides can be grown by low temperature processing, and their use in injecting electrons in silicon nano-crystals by direct as well as Fowler-Nordheim tunneling is well known in the art. The nano-crystals 108 can be formed by direct implantation into the block of electrical insulating material 104, preferably an oxide, followed by high temperature annealing. Species required for termination of surfaces (examples are Er, F, Ca, In, etc.) can also be implanted and heat treated into bonding sites. The nano-crystals 108 can also be directly deposited on the bottom layer of electrically conductive material 102, which is preferably silicon dioxide. FIG. 3 shows an example of this. Light emission from these crystals can be in the 2.3 to 1.3 eV range (530 nm to 950 nm) range, and the terminating species can also be introduced in-situ during the deposition process.

Figure 4:
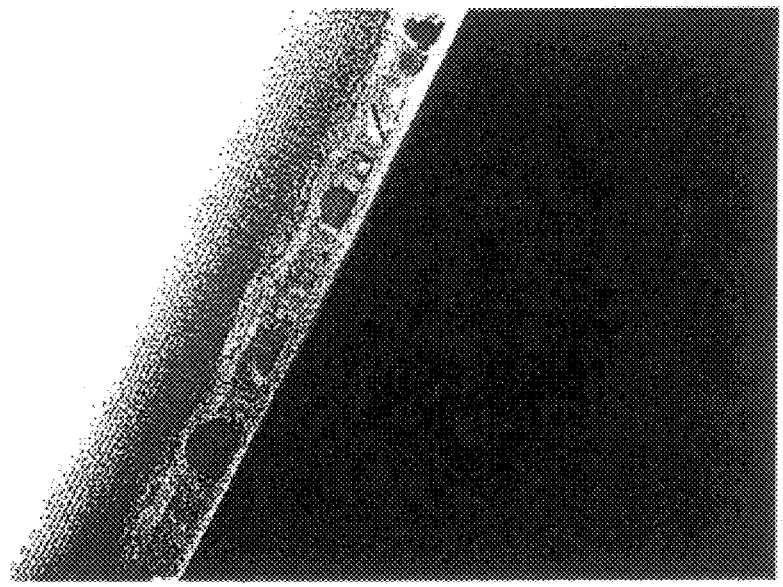
FIG. 4 is a photograph showing germanium-silicon nano-crystals deposited on an oxide surface.
Figure 5:
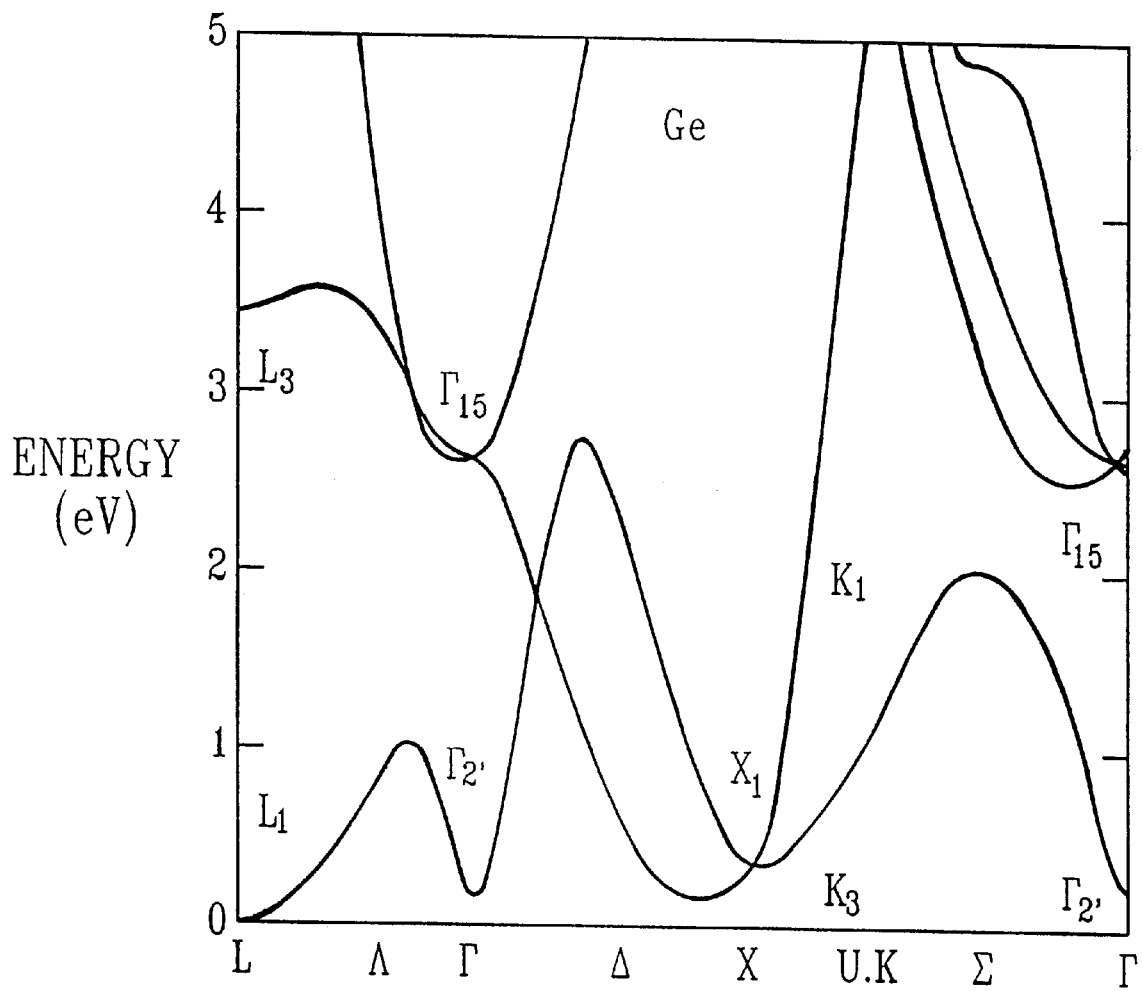
FIG. 5 is a graph showing the conduction band structure of germanium.

Equally important is the use of other group IV as well as other semiconductors in the nano-crystal layer 108, small nano-crystals can be formed by proper selection of temperature and conditions. FIG. 4 shows an example of Germanium-silicon nano-crystal complexes deposited on tunnel oxide. Germanium has a bulk band-structure shown in FIG. 5. Like silicon it is an indirect bandgap material. However, when used as a nano-particle with surface termination, it allows efficient radiative transitions.

Additionally, stress can be introduced in the structure. Introduction of stress, causes r valley minima to change in energy at a different rate than the L or X valley minima. Germanium's conduction electrons are largely in the L valley. However, the r valley is only ≈0.2 eV away. Using stress, and even at a lower stress, Germanium can be made to luminesce. Indeed, in bulk structures, hot carrier based efficient emission has been demonstrated in germanium. These properties are due to modified stress which can be introduced by oxidizing a surrounding matrix of silicon or poly-silicon. Structures containing Germanium nano-particles can be made to luminesce to a wavelength of about 1300 nm. SiGe composites thus, can luminesce between about 530 nm and 1300 nm.

III-V materials which are usually naturally direct can also be formed by deposition on the bottom later of electrically insulating material 110. Since the light emitting device can be formed among the end steps of a process integration, contamination issues are not a problem. III-V's deposited by epitaxy, such as GaAs, GaAlAs, GaInAs, GaInAsP, GaInP, etc., form poly-crystalline material at growth temperatures in excess of 400° C. by molecular or chemical epitaxy techniques when grown to thicknesses in excess of 100 nm. When limited material is grown, such as for nano-crystals in 2–10 nm range, the smaller nano-crystals form as single crystal islands, and they can be clad with a larger bandgap material to allow efficient recombination. The top layer of electrically insulating material 112 can be deposited on this (in some forms it may not be necessary) and the top layer of electrically conducting material 106 deposited. Nano-crystals are quite stable and allow higher temperature processing unencumbered by the problems of pseudomorphic growth.

Also provided are bottom and top electrodes 114, 116 connected to the bottom and top layers of electrically conductive materials 102, 106, respectively, for applying a voltage therebetween. Preferably, the bottom and top layers of electrically conductive materials 102, 106 also comprise the bottom and top electrodes 114, 116. The top electrode 116 is preferably a deposited film of optically transparent thin oxide such as indium tin oxide. The bottom electrode 114 can be poly-silicon or substrate, or a metal electrode.

The operation of the light emitting structure 100 will now be described in which light is emitted when an electrical potential is applied between the top and bottom electrodes 114, 116 resulting in the injection of electrons, as well as by the injection of electrons and holes caused by the potential difference between the top and bottom electrodes 114, 116. When an electron loses energy in transferring from a defect state it emits photons (light). Also, electrons and holes in the nano-crystals 108 directly recombine to emit photons. The stressing and interface of silicon and germanium discussed above play an important role in the recombination of electrons and holes in the nano-crystals 108.

The electrons and holes can recombine because electron tunneling occurs between the nano-crystals 108 and the top and bottom electrodes 114, 116 through the block of electrically insulating material 104. Electrons or holes can also transfer between nano-crystals 108 by tunneling because of the spacing between them and the slight barrier in the spacing between them in the form of the electrically insulating material comprising the block 104. The nano-crystals are therefore spaced apart so that confinement effects take place, this requires a barrier of the electrically insulating material of the block 104, preferably a thin oxide, around the nano-crystals 108. If the nano-crystals 108 touch each other than they become a continuous film and their light emitting characteristics cease to exist.

In the light emitting structure 100 light is emitted in all directions, however it is preferable to collect the light from the top by making the top electrode 116 and top layer of electrically conductive material 116, 106 (which is preferably an integral electrode) from a transmissive material, such as a thin metal, or conducting oxides such as tin oxide, indium oxide, and their mixtures, or even conducting polymers. To maximize the collection of the emitted light from the top, the bottom layer of electrically conductive material 102 can be made of a reflective material.

Figure 2:
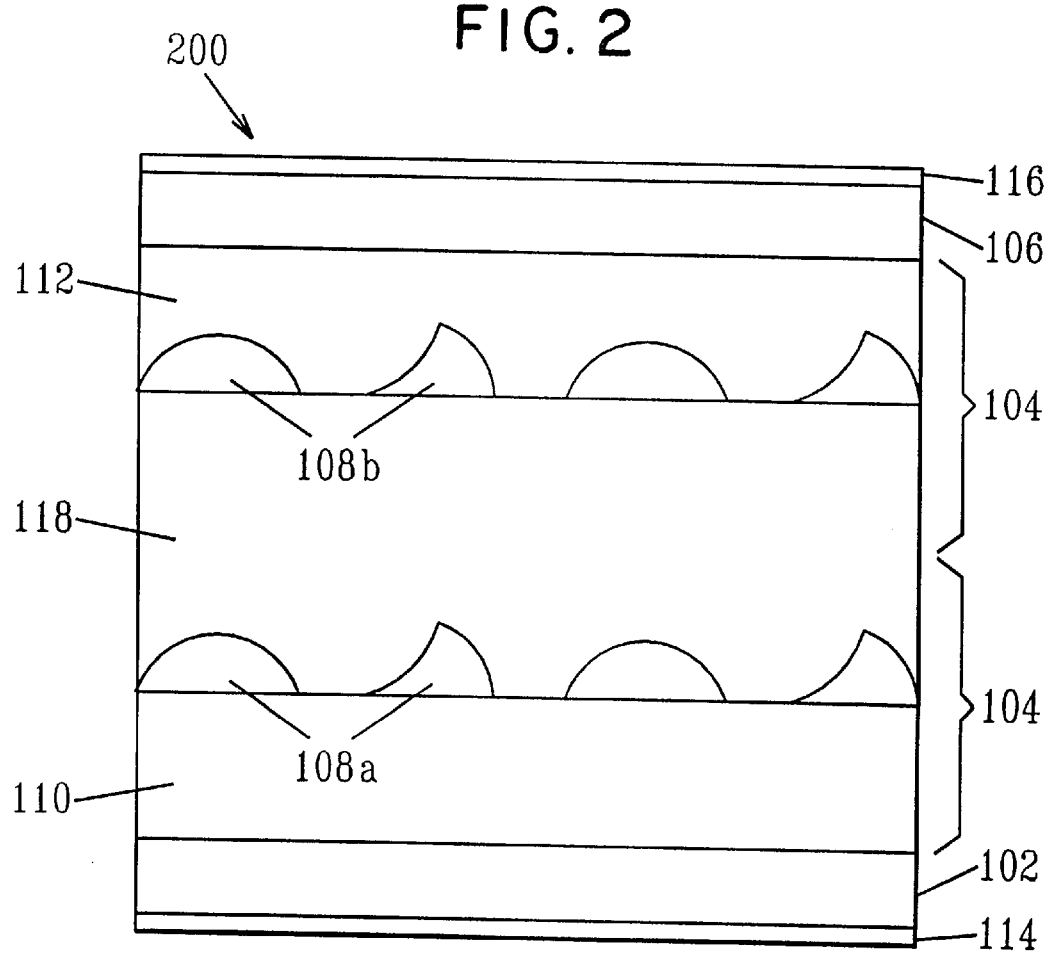
FIG. 2 illustrates a second embodiment of the light emitting structure of the present invention.

A second embodiment of the present invention generally referred to by reference numeral 200 and illustrated in FIG. 2 of the drawings in which all components similar to or identical with those in FIG. 1 are designated with the same reference numeral, is merely modified with regard to the first embodiment, in that a plurality of blocks 104 are disposed between the bottom and top layers of electrically conducting material 102, 106. The blocks 104 are stacked one upon another on the bottom layer of electrically conductive material 102. It should be noted that although FIG. 2 illustrates two blocks 104, any number can be used. At least a portion of the block 104 adjacent to the bottom layer of electrically conductive material 102 is optically transparent with the remaining blocks being wholly transparent. The nano-crystals 108 are disposed within each block 104 and thereby electrically insulated from the bottom and top layers 102, 106.

The blocks 104 of the light emitting structure 200 preferably comprise a bottom layer of electrically insulating material 110 which have a bottom plurality of discrete nano-crystals 108a disposed thereon. At least one middle layer of electrically insulating material 118 is formed over the bottom nano-crystals 108a and have a middle plurality of nano-crystals 108b disposed thereon. A top layer of electrically insulating material 112 is then formed over the last middle plurality of nano-crystals 108b.

For simplicity, FIG. 2 illustrates a light emitting structure 200 comprising one middle layer of electrically insulating material 118, however, any number of middle layers 118 can be stacked upon one another before the top layer 112 is formed. Preferably, the middle layers 118 and the top layer of electrically insulating material 112 are optically transparent.

Figure 6:
FIG. 6 is a photograph showing the second embodiment of the present invention emitting light.

The second embodiment of the light emitting structure 200 operates in principal the same as the first embodiment 100, a photograph of which is shown in FIG. 6. However, the stacking of the blocks 104, greatly increases the amount and intensity of light that is emitted and is therefore more useful in higher intensity applications.

This invention therefore pertains to the principles of structures, use of terminated nano-crystals of a variety of materials (Group IV, III-V, and II-IV), deposition techniques of such structures in composites such as SiGe or as individuals such as germanium or GaAs, etc., the use of stress by oxidation of laterally confining silicon to form an oxide, and the use of thin oxides with poly-silicon, silicon, or other electrode materials that can efficiently inject electrons and holes. These structures are particularly useful in providing opto-electronic integration capability in silicon technology. Thus, silicon circuits can first be made with existing production lines and the light emitting structures of the present invention placed and connected directly to them so that information can be sent optically rather than electrically.

While there has been shown and described what is considered to be preferred embodiments of the invention, it will, of course, be understood that various modifications and changes in form or detail could readily be made without departing from the spirit of the invention. It is therefore intended that the invention be not limited to the exact forms described and illustrated, but should be constructed to cover all modifications that may fall within the scope of the appended claims.

Having thus described our invention, what we claim as new, and desire to secure by Letters Patent is:

1. A light emitting device comprising:
    a bottom layer of electrically conductive material,
    a block of oxide material disposed on said bottom layer of electrically conductive material, at least a portion of said block being optically transparent,
    a top layer of electrically conductive material disposed on said block,
    a plurality of discrete nano-crystals of a material selected from the group consisting of SiGe, SiC and Group III-V disposed within said block and thereby electrically insulated from said bottom layer and said top layer, and bottom and top electrodes connected to said bottom layer and said top layer, respectively, for applying a voltage therebetween, said top electrode is an optically transparent material wherefrom light generated by the application of said voltage between said electrodes is emitted.

2. The light emitting device as claimed in claim 1, wherein said block comprises a bottom layer of said oxide material having said discrete nano-crystals disposed thereon and a top layer of said oxide material formed over said nano-crystals.

3. The light emitting device as claimed in claim 2, wherein said top layer of oxide material is optical transparent.

4. The light-emitting device as claimed in claim 1, wherein said bottom and top layers of electrically conductive material are polysilicon.

5. The light-emitting device as claimed in claim 4, wherein said bottom layer of said electrically conductive material is p-doped polysilicon.

6. The light-emitting device as claimed in claim 4, wherein said top layer of said electrically conductive material is n-doped polysilicon.

7. The light-emitting device as claimed in claim 1, wherein said top electrode is indium tin oxide.

8. The light emitting device as claimed in claim 1, wherein said nano-crystals are formed from a material selected from the group consisting of GaAs, GaAlAs, GaInAs, GaInAsP, GaInP, GaN and GaInN.

9. The light emitting device as claimed in claim 1, wherein said nano-crystals are substantially spaced apart within said block so as not to form a continuous film.

10. The light emitting device as claimed in claim 1, wherein said nano-crystals are substantially spaced apart so as not to form a continuous film and wherein said nano-crystals have sizes in the range of 15 to 170 Angstroms.

11. The light emitting device as claimed in claim 9 or 10, wherein said spacing between said nano-crystals is greater than one nanometer.

12. The light emitting device as claimed in claim 1 wherein said top and bottom electrodes are omitted and said top layer of electrically conductive material is composed of an optically transparent material.

13. A light emitting device comprising:
    a bottom layer of electrically conductive material,
    a plurality of oxide blocks stacked upon one another and disposed on said bottom layer, at least a portion of said block adjacent to the bottom layer being optically transparent, the remaining blocks being wholly transparent,
    a top layer of electrically conductive material disposed on said plurality of blocks,
    a plurality of discrete nano-crystals of a material selected from the group consisting of SiGe, SiC and Group III-V disposed within each block and thereby electrically insulated from said bottom layer and said top layer, and bottom and top electrodes connected to said bottom layer and said top layer, respectively, for applying a voltage therebetween, said top electrode is an optically transparent material wherefrom light generated by the application of said voltage between said electrodes is emitted.

14. The light emitting device of claim 13, wherein said plurality of oxide blocks comprises a bottom layer of said oxide material having a bottom plurality of discrete nano-crystals disposed thereon, at least one middle layer of oxide material formed over said bottom nano-crystals and having a middle plurality of nano-crystals disposed thereon, and a top layer of oxide material formed over the last middle plurality of nano-crystals.

15. The light-emitting device as claimed in claim 14, wherein said middle and top layers of said oxide material is optically transparent.

16. The light-emitting device as claimed in claim 13, wherein said bottom and top layers of electrically conductive material are polysilicon.

17. The light-emitting device as claimed in claim 16, wherein said bottom layer of said electrically conductive material is p-doped polysilicon.

18. The light-emitting device as claimed in claim 16, wherein said top layer of said electrically conductive material is n-doped polysilicon.

19. The light-emitting device as claimed in claim 13, wherein said top electrode is indium tin oxide.

20. The light emitting device as claimed in claim 13, wherein said nano-crystals are formed from a material selected from the group consisting of GaAs, GaAlAs, GaInAs, GaInAsP, GaInP, GaN and GaInN.

21. The light emitting device as claimed in claim 13, wherein said nano-crystals are substantially spaced apart within said block so as not to form a continuous film.

22. The light emitting device as claimed in claim 13, wherein said nano-crystals are substantially spaced apart so as not to form a continuous film and wherein said nano-crystals have sizes in the range of 15 to 170 Angstroms.

23. The light emitting device as claimed in claim 21 or 22, wherein said spacing between said nano-crystals is greater than one nanometer.

24. The light emitting device as claimed in claim 13 wherein said top and bottom electrodes are omitted and said toD layer of electrically conductive material is composed of an optically transparent material.

* * * * *

UNITED STATES PATENT AND TRADEMARK OFFICE
CERTIFICATE OF CORRECTION

PATENT NO. : 6,236,060 B1
DATED : May 22, 2001
INVENTOR(S) : Kevin K. Chan et al.

It is certified that error appears in the above-identified patent and that said Letters Patent is hereby corrected as shown below:

<u>Column 8, claim 24,</u>
Line 32, "toD" should read -- top --

Signed and Sealed this

Twenty-sixth Day of February, 2002

*Attest:*

*Attesting Officer*

JAMES E. ROGAN
*Director of the United States Patent and Trademark Office*